US010297083B2

(12) United States Patent
Kurz et al.

(10) Patent No.: US 10,297,083 B2
(45) Date of Patent: May 21, 2019

(54) METHOD AND SYSTEM FOR DETERMINING A MODEL OF AT LEAST PART OF A REAL OBJECT

(71) Applicant: Apple Inc., Cupertino, CA (US)

(72) Inventors: Daniel Kurz, Sunnyvale, CA (US); Lejing Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 159 days.

(21) Appl. No.: 15/022,184

(22) PCT Filed: Sep. 16, 2013

(86) PCT No.: PCT/EP2013/069148
§ 371 (c)(1),
(2) Date: Mar. 15, 2016

(87) PCT Pub. No.: WO2015/036056
PCT Pub. Date: Mar. 19, 2015

(65) Prior Publication Data
US 2016/0232678 A1     Aug. 11, 2016

(51) Int. Cl.
*G06T 19/00*     (2011.01)
*G06F 17/30*     (2006.01)
(Continued)

(52) U.S. Cl.
CPC ........ *G06T 19/006* (2013.01); *G06F 17/3087* (2013.01); *G06F 17/30247* (2013.01);
(Continued)

(58) Field of Classification Search
CPC ......... G06T 19/006; G06T 2207/30244; G06T 7/344; G06T 7/74; G06T 7/75; G06F 17/302147; G06F 17/3087
See application file for complete search history.

(56) References Cited

U.S. PATENT DOCUMENTS

2008/0147730 A1    6/2008   Lee
2009/0109216 A1    4/2009   Uetabira
(Continued)

FOREIGN PATENT DOCUMENTS

WO      2013029674 A1     3/2013

*Primary Examiner* — Michelle L Sams
(74) *Attorney, Agent, or Firm* — Blank Rome LLP

(57) ABSTRACT

The invention is related to a method of determining a model which describes at least part of a real object, which comprises the steps of: providing a first image of at least part of the real object to a first processing device, wherein the first image is captured by a camera, sending at least part of the first image to a second processing device which is physically separate from the first processing device, determining on the second processing device a registration between the first image and a first model provided on the second processing device according to the at least part of the first image received at the second processing device, determining geometric information for at least one pixel in the first image according to the registration, sending the geometric information from the second processing device to the first processing device, and using at least part of the geometric information received at the first processing device together with at least part of the first image to determine on the first processing device a second model comprising geometric and material information which describes at least part of the real object.

20 Claims, 9 Drawing Sheets

(51) Int. Cl.
    *G06F 17/50*     (2006.01)
    *G06T 7/33*      (2017.01)
    *G06T 7/73*      (2017.01)

(52) U.S. Cl.
    CPC .............. *G06F 17/50* (2013.01); *G06T 7/344* (2017.01); *G06T 7/74* (2017.01); *G06T 7/75* (2017.01); *G06T 2207/30244* (2013.01)

(56) References Cited

U.S. PATENT DOCUMENTS

2010/0309226 A1\* 12/2010 Quack ............... G06F 17/30244
                                                    345/634
2011/0085697 A1\*  4/2011 Clippard .............. G06K 9/4652
                                                    382/100
2011/0164163 A1\*  7/2011 Bilbrey ................ G06F 1/1694
                                                    348/333.01
2012/0243739 A1   9/2012 Fukuchi \* cited by examiner

METHOD AND SYSTEM FOR DETERMINING A MODEL OF AT LEAST PART OF A REAL OBJECT

CROSS-REFERENCE TO RELATED APPLICATION

This application is a National Phase application claiming benefit to International Application Number PCT/EP2013/069148 filed on Sep. 16, 2013.

FIELD OF THE DISCLOSURE

The present disclosure is related to a method of determining a model which describes at least part of a real object. For example, the determined model may be used in an image processing method and/or vision-based localization method. The present disclosure is further related to a system and a computer program product comprising software code sections which are adapted to perform such method.

There are many applications which benefit from the visual recognition of real objects. Examples include location or landmark recognition applications that compare a current (query) camera image with a large number of images of landmarks or buildings stored in a database to determine which place the camera is facing. Based on that, the application may provide the user with information relevant to that location. Another example application would recognize if there is any DVD case or book present in a query camera image, and if so, it would show reviews and information on related products and where to purchase them. For many applications it is also useful to know where the object or landmark is located in the camera image and potentially its orientation and scale, or a camera pose when capturing the camera image relative to the object or landmark. This enables placing relevant digital information right onto the real object in the camera image and is for example used in Augmented Reality applications.

With an increasing number of objects and/or locations to recognize, the database size of such databases also increases, and at some point it becomes infeasible to transmit the database to a mobile device and store it on the device. As a consequence, it becomes infeasible to perform visual recognition on the device itself. For such cases, so-called client-server-based approaches have been proposed. Server computers can hold large databases that optionally can contain different visual appearances of an object. For example, for an outdoor environment, the database might contain a version of the environment on a sunny day and one on a cloudy day. The visual appearances could be stored as 2D or 3D images. They could also be stored as visual or image descriptors, which may be vectors containing real-valued numbers. For a book cover or DVD case, for instance, it makes sense to build a visual recognition database from images taken from different viewpoints (see, e.g., reference [1]) and with different cameras resulting in different image characteristics such as noise, blur and contrast. Even though visual recognition methods aim at invariance to such factors, changes therein still can significantly impair the results. Improving invariance to such transformations usually increases the computational costs, which again makes it more feasible on the server side rather than on a client device.

Client-server-based approaches exist, where a client device (also commonly called "client") sends a query image to a server computer (also commonly called "server"). After performing visual recognition or registration with reference models stored in the server database, the server then either returns the result that it did not recognize anything, or it returns as a result the identifier(s) of the best fitting reference model(s) in the database, see e.g. references [1-4].

In other approaches, as disclosed in e.g. references [5, 6], the server additionally returns the camera pose, i.e. the position and/or orientation of the camera in the coordinate system of the reference model in the database. This information can then be used to initialize incremental camera pose tracking on the client device, see e.g. reference [5]. Note that in this case the client device already has a reference model of the environment (or object) to track which is stored on the client device.

Other approaches, such as in reference [7], send the reference model of the recognized object from the server to the client device to allow for subsequent camera pose localization and tracking with respect to the recognized object on the client device. This approach is preferable as it does not require a database of reference models on the client device.

In case the server returns a reference model of the object, e.g. as a (compressed) bitmap image for planar objects or in a sparse representation of 3D points with associated feature descriptors for a general 3D object, this imposes two problems. First of all the reference model can be large and therefore require large amounts of data to be transmitted from the server to the client side. In particular the description of the textural and material information usually consumes a majority of memory. Even more importantly, the visual appearance and material of the real object described in the reference model is based on imagery that was taken offline and therefore is usually taken with a camera different from the client's camera in an environment different from that of the client and therefore under illumination different from the situation the client is currently located in. As explained earlier, if these parameters differ significantly, it can result in poor localization and tracking results on the client device. Therefore, it is crucial that the reference model is as consistent as possible with the current situation.

The visual appearance of a real object is typically defined by two parts: geometry and material (such as texture). The geometry of an object refers to the spatial dimensions of the object including its size, its shape, its surface, the absolute or relative 3D position of points of the object, the distance between a given point of reference and points of the object, or surface normal vectors. On the other hand, the material of an object can be defined for every point on the object individually and refers to any approximation and/or subset of the reflectance of the point, its bidirectional reflectance distribution function (BRDF), the bidirectional scattering distribution function (BSDF), the radiance it emits, its texture, its color, or its albedo. Note that the material information may describe the light reflected to a certain point (e.g. the optical camera center) under a certain illumination (incident light field) rather than its reflectance or scattering properties. The material also refers to textures.

There are methods that send an image from a client device to a server, then perform registration of a model with the image and, as a result, transform the transmitted image to the coordinate system of the model, see e.g. reference [8]. More specifically, the server performs optical character recognition (i.e. the model is an alphabet in this case), and if successful, rotates the image such that the found characters are upright. Finally, the corrected image, transformed into the model coordinate system, is sent back from the server to the client device for subsequent use. While the resulting image is both consistent with the current visual appearance of the object and expressed in a (partially) known coordinate system, it still requires sending the entire visual information from the server to a client device.

It would be beneficial to provide a method of determining a model which describes at least part of a real object captured in a camera image such that the model is consistent with the visual appearance of the real object in the camera image, but with reduced amount of information transmitted from a processing device, such as a server, to another processing device, such as a client device.

According to an aspect, there is provided a method of determining a model which describes at least part of a real object, which comprises the steps of: providing a first image of at least part of the real object to a first processing device, wherein the first image is captured by a camera, sending at least part of the first image to a second processing device which is physically separate from the first processing device, determining on the second processing device a registration between the first image and a first model provided on the second processing device according to the at least part of the first image received at the second processing device, determining geometric information for at least one pixel in the first image according to the registration, sending the geometric information from the second processing device to the first processing device, and using at least part of the geometric information received at the first processing device together with at least part of the first image to determine on the first processing device a second model comprising geometric and material information which describes at least part of the real object.

According to the invention, there is thus provided a method of determining a model which describes at least part of a real object captured in a camera image such that the model is consistent with the visual appearance of the real object in the camera image without the need to transfer any information on the object's material from a server to a client device.

According to another aspect, there is provided a system for determining a model which describes at least part of a real object, comprising a first processing device provided with a first image of at least part of the real object, wherein the first image is captured by a camera, and a second processing device which is physically separate from the first processing device. The first processing device is configured to send at least part of the first image to the second processing device, the second processing device is configured to determine a registration between the first image and a first model provided on the second processing device according to the at least part of the first image received at the second processing device. The second processing device is further configured to determine geometric information for at least one pixel in the first image according to the registration, and to send the geometric information to the first processing device. The first processing device is configured to determine a second model comprising geometric and material information which describes at least part of the real object using at least part of the received geometric information together with at least part of the first image.

According to another aspect, there is provided a computer program product comprising software code sections which are configured to perform a method according to the invention as described herein.

For example, the first processing device and the second processing device are components of a client-server architecture, wherein the first processing device is or is comprised in a client device and the second processing device is or is comprised in a server.

According to an embodiment, the first processing device is comprised in a mobile device, such as a mobile phone, a tablet computer, a handheld device, a head-worn device, a smart watch, or a wearable computer with a video-see-through display or optical-see-through head-mounted display. Such displays are as such known to the skilled person.

According to an embodiment, the first processing device is comprised in a mobile device, such as a mobile phone, a tablet computer, a handheld device, a head-worn device, a smart watch, or a wearable computer with a video-see-through display or optical-see-through head-mounted display. Such displays are as such known to the skilled person.

The first image could generally be any image capturing at least part of the real object. The first image may be in the RGB format. It can also be applied to any other color format and also to monochrome images, for example, to cameras providing images in grayscale format. The first image may further include depth data. The depth data does not need to be provided in the same resolution as the first image. A camera providing an image with depth data is often called RGB-D camera. A RGB-D camera system could be a time of flight (TOF) camera system. The first image may also capture light that is invisible to human eye, such as infrared light. At least part of the first image may also be generated by a thermal imaging camera.

The first processing device may be comprised in a client device that has at least one computing processor, such as a desktop PC, laptop, mobile phone or a tablet computer. The second processing device may be or may be comprised in a server computer (referred to herein as "server") that has at least one computing processor. The first processing device communicates with the second processing device via a cable, wirelessly or via a computer network.

The first processing device may communicate with the second processing device indirectly, for example via a third device that has a capability to send and receive digital data. The digital data could include the first image, geometric information or their combinations. The third device may also comprise at least one processing unit. The first processing device could send and/or receive digital data to and/or from the third device via cable or wirelessly, and the third device could also send and/or receive the digital data or the processed digital data to and/or from the second processing device via cable or wirelessly. In this case, the first processing device does not directly send and/or receive the digital data to and/or from the second processing device. For example, the first processing device could be a head mounted device, such as a head mounted display, comprising the camera. The head mounted device may communicate with, e.g., a mobile phone that is the third device wirelessly based on, for instance, Bluetooth technologies. The mobile phone communicates with, e.g., a supercomputer as second processing device, for example via a wireless LAN.

The first processing device may comprise more than one separate device. For example, the more than one separate device, such as multiple devices housed in respective separate housings, communicate with each other via cable or wireless. For example, the first processing device could include a head mounted device comprising the camera and a mobile phone.

The first model also refers to a reference model of the real object. The first model is provided on the second processing device. It may be stored on the second processing device or may be otherwise provided thereto.

The first model of the real object, which typically enables visual localization and tracking, may comprise spatial information on the shape and/or dimensions of the real object (i.e., its geometry). The first model may further comprise information on the texture, color, and/or their combinations (i.e. material) of (parts of) the real object. A very common representation of the first model combines 3D points that provide a sparse spatial description of the geometry. The first model may further have associated feature descriptors that describe the texture of features (as part of the material) in an image patch around the 3D points. The feature descriptors are a mathematical representation describing local features in images or image patches, such as SIFT (Scale-invariant feature transform), SURF (Speeded Up Robust Features), and LESH (Local Energy based Shape Histogram). The features are such as but not limited to intensities, gradients, edges, lines, segments, corners, descriptive features or any other kind of features, primitives, histograms, polarities or orientations.

The first model can further, for example, be represented as a model comprising 3D vertices and polygonal faces and/or edges spanned by these vertices. Edges and faces of the model may also be represented as splines or NURBS surfaces. The first model may in this case be accompanied by a bitmap file describing its texture and material where every vertex in the polygon model has a texture coordinate describing where in the bitmap texture the material for this vertex is stored. The first model can also be represented by a set of 3D points as, for example, captured with a laser scanner. The points might carry additional information on their color or intensity.

The first model may also be a bitmap. In this case, the geometry of the object is a rectangle while its material is described for every pixel in the bitmap. Additionally, pixels in the bitmap might contain additional information on the depth of the imaged pixel from the capturing device. Such RGB-D images are also a possible representation for the first model and comprise both information on the geometry and the material of the object.

What was explained above for the first model also applies to the second model, with the difference that the second model always comprises some information on a texture, color, and/or any other material property of at least part of the real object. The first model and the second model may or may not use the same representation.

It should be noted that the material of a real object may be described with the same primitives as the geometry of an object, e.g. points, or lines. If the real object is for example a stop sign, its geometry could be described with eight line segments (building an octagon), while its material could be described with line segments building the characters of the word "STOP". Both together would form the model in this case.

The second processing device (such as a server) may store a large number of reference models for different real objects or environments. The first model of the real object may be determined or selected among reference models provided on the second processing device according to the at least part of the first image received at the second processing device. For this, visual features could be extracted from the first image and represented by feature descriptors. The features are for example, but not limited to, intensities, gradients, edges, lines, segments, corners, descriptive features and/or any other kind of features, primitives, histograms, polarities or orientations. Similarity measures could be used to compare the feature descriptors of the first image and feature descriptors associated with each reference model provided on the second processing device. Common examples of similarity measures include sum-of-squared differences (SSD), cross-correlation, and mutual information. A reference model that has the highest similarity based on the similarity measures could be determined as the first or reference model of the real object. Approaches to speed up correspondence search or approaches that use descriptors representing an entire image, object, or model, can also be applied for determining the first model of the real object. Examples include Vocabulary Trees, approximate nearest neighbour search, locality-sensitive hashing, best bin first, and balanced box-decomposition tree based search.

Geometric information of the real object could also be extracted from the first image and matched to geometric information of reference models provided on the second processing device. Geometric information could be edges, corners, and/or geometrical shapes (e.g. circle, sphere, etc.).

Edge features extracted from the first image could be matched with edge information associated with each reference model provided on the second processing device. The matching could be performed based on edge-based matching or registration, for example by minimizing point-to-line or line-to-line distance. The first model could be determined as the best fitting model among the models provided on the second processing device based on the edge-based matching.

The determination of the first model is preferred to be performed on the second processing device.

Further, a registration between the first image and the first model is determined. The registration may describe a homography transformation between at least part of the first image and at least part of the first model, particularly when the at least part of the first model represents planar parts of the real object. The registration may describe a translation and orientation (i.e. a rigid body transformation or pose) of the camera when capturing the first image relative to the real object.

The registration may be determined by edge-based or point-based matching. For this, correspondences between 2D points or lines in the first image and 3D points or lines in the reference model are used to determine the registration. Given point or line features in both the first image and the first model, the correspondences can be estimated by using RANdom SAmple Consensus (RANSAC), for example.

The determination of the registration between the first image and the first model is preferred to be performed on the second processing device, particularly a server.

The determination of the first model and the determination of the registration between the first image and the first model may be performed together in a single step. For example, it is possible to perform registration between the first image and each of the reference models provided on the server. A reference model that is most matched with the first image may be determined as the first model. The matching or registration between a model and the first image could be quantified by 2D image errors in pixels, 3D distance errors in millimeters, and/or rotation errors in degrees for example.

The geometric information for at least one pixel in the first image is determined according to the registration between the first image and the first model. The geometric information for at least one pixel in the first image could be a 3D position of a 3D point corresponding to the at least one pixel. The geometric information, e.g. 3D position, may be expressed in a coordinate system of the real object or in a coordinate system of the first model (which are corresponding to each other, since the real object is represented by the first model). The geometric information could also be a transformation, e.g. a homography or a rigid body transformation. The rigid transformation describes a translation and rotation in 2D or 3D space. The geometric information could be any information describing a shape or dimension of the real object or a transformation that relates 2D image coordinates in the coordinate system of the first image and 3D coordinates in the coordinate system of the real object. The geometric information could be determined according to the registration between the first image and the first model, which is preferred to be performed on the server.

The determined geometric information is then sent from the second processing device (such as server) to the first processing device (such as client device). The second model that represents at least part of the real object is created based on at least part of the received geometric information and at least part of the first image. The second model contains geometric and material (or texture) information. The material information stems from the at least part of the first image. The second model could be a 2D or 3D image. The second model may contain 3D geometric information, such as points and/or edges. The second model may also be a 3D model, such as a CAD model with surface texture information.

The second model could be further used on the first processing device as a tracking model for vision-based localization and/or tracking in order to locate and/or track positions of the camera relative to the real object, or in order to detect image positions of a part of the real object in images captured by the camera. For example, a second image of at least part of the real object is captured by the camera. At least part of the second model can be employed together with at least part of the second image for determining a camera pose when capturing the second image relative to the real object or for detecting an image position of at least part of the real object in the second image.

A variety of methods to localize and track real objects in images or to localize and track the position of a camera with respect to a real object based on camera images exist. Depending on the representation of the second model, the tracking method might, for example, be based on local image feature descriptors. In this case, a method might detect salient features (e.g. points, edges, lines, etc.) in a current image, compute descriptors for these features based on pixel intensities in the camera image in a region around a feature and then match these 2D feature descriptors against 3D feature descriptors of the second model. Established 2D-3D correspondences can finally be used to determine the camera position and orientation with respect to the second model and thereby with respect to the real object.

If the second model is a bitmap representing a planar object, a dense image registration method, e.g. Forward-Compositional, Inverse-Compositional, Efficient Second order Minimization can be used to register a camera image with the model and the transformation to register these together with the camera's intrinsic parameters can be used to compute the pose of the camera with respect to the real planar object.

For a second model that comprises only 3D line segments (representing both the geometry and the material of the object), a tracking method may project this model into the camera image with an assumption of the camera pose with respect to the object and based on that iteratively update the transformation to project the model into the camera image until the projected edges of the model fit the gradients in the image best.

The present invention proposes to decouple these two kinds of information and to let the second processing device (e.g. server) only return the spatial (i.e. geometric) information of the first model and spatial information on the position of the real object in the camera image which allows the first processing device (e.g., client device) to create an up-to-date model (i.e. the second model) of the real object present in the camera image (i.e. the first image) by combining the geometric information obtained from the second processing device with material (i.e. texture) information from the captured camera image and transmitted to the second processing device. By not sending any material information from the second processing device (in the present example: server) to the first processing device (in the present example: client device), not only traffic can be reduced, but more importantly, the resulting reference model (second model) describes the 3D real object in exactly the situation it is in on the client side captured with exactly the same camera that is subsequently potentially used for visual localization and tracking on the client device.

It is important to mention that this method substantially differs from monocular visual Simultaneous localization and mapping (SLAM) algorithms that reconstruct a map, i.e. a model, of a previously unknown real environment or a previously unknown real object on-the-fly while tracking it. While monocular SLAM methods need multiple images to create the model, the present invention may be based on a single image only. The most fundamental difference, however, is that while SLAM methods usually are model-free and operate in an arbitrary coordinate system at arbitrary scale, the present invention results in a model of the real environment or object in a known coordinate system at known scale which ultimately allows for placing precisely registered overlays in a known coordinate system on top of the real object in the camera image. Further, SLAM does not communicate with a server and receive any geometric or spatial information related to one or more pixels in one or more images. The current invention has the advantage of a server to obtain geometric or spatial information of a real object corresponding to one or more pixels of an image, and reconstructing a model of the real object based on the geometric or spatial information and the image which describes (part of) the material of the real object. The resulting model combines the geometric information received from the server and the material information from the image.

According to an embodiment, the geometric information is determined in a coordinate system of the first model or in a coordinate system of the camera.

According to an embodiment, the invention comprises providing a second image of at least part of the real object to the first processing device, wherein the second image is captured by a camera, and determining on the first processing device a pose of the camera while capturing the second image relative to the real object according to at least part of the second image and at least part of the second model.

According to an embodiment, the invention comprises providing a second image of at least part of the real object to the first processing device, wherein the second image is captured by a camera, and determining on the first processing device an image position of at least part of the real object in the second image according to at least part of the second image and at least part of the second model.

For example, the camera pose and/or the image position is used in an Augmented Reality application to overlay a virtual object with the second image.

For example, the real object is a planar object and the determining and sending the geometric information from the second processing device to the first processing device comprises determining and sending 3D positions of a plurality of pixels in the first image or 2D pixel positions of a plurality of 3D points on the planar object or a homography transforming the first image to the first model or vice versa.

According to another embodiment, the real object is a three-dimensional object and the determining and sending the geometric information from the second processing device to the first processing device comprises determining and sending 3D positions in the coordinate system of the first model corresponding to 2D pixels in the first image.

According to an embodiment, the invention further comprises sending at least one reading from at least one sensor associated with the first processing device to the second processing device, wherein the at least one reading is used in the step of determining the registration. For example, the at least one sensor is at least one of a GPS sensor, magnetometer, accelerometer, and gyroscope.

According to a further embodiment, sending at least part of the first image includes sending a processed version of the first image from the first processing device to the second processing device, wherein the processed version of the first image includes data derived from at least one of compression, encryption, cropping, scaling, blurring, sharpening, color conversion, and conversion into a sparse representation based on feature descriptors of any representation that allows for registration.

For example, sending at least part of the first image to the second processing device uses at least one of the following techniques: Bluetooth radio, infrared light, ZigBee, Wi-Fi, orthogonal frequency-division multiplexing (OFDM), WiMAX, cellular network, mobile network, Global System for Mobile Communications, Personal Communications Service, Digital Advanced Mobile Phone Service.

As mentioned above, the first processing device may use at least part of the second model in a vision-based localization method, such as for visual camera localization and tracking relative to the real object.

According to an embodiment, the first processing device updates material information of the second model for at least part of the second model with material information obtained from a second image of at least part of the real object captured by a camera.

According to another embodiment, the first processing device updates material information of the second model for at least part of the second model with material information obtained from the first model.

According to an embodiment, the invention further comprises performing a feature detection on the first image by the second processing device, wherein sending the geometric information from the second processing device to the first processing device comprises sending a 3D position corresponding to 2D features detected in the feature detection.

According to an embodiment, sending the geometric information from the second processing device to the first processing device includes transmitting a distance of at least part of the real object to the camera, a camera pose of the first image and intrinsic camera parameters from the second processing device to the first processing device.

DESCRIPTION OF THE DRAWINGS

Aspects and embodiments of the invention will now be described with respect to the drawings, in which:

FIG. 1 shows a flowchart of a method according to an embodiment of the invention. In a first step 101, a first image of at least part of a real object is captured, for example with a camera attached to a first processing device, which is in the present embodiment a client device or comprised in a client device. In a further step 102, this image (or at least a part of it) is then sent from the client device to a second processing device, which is in the present embodiment a server computer. The server computer then performs registration of a first model with the image (or at least a part of it) and determines a 3D position of at least one pixel in the first image (step 103) and as a result sends back (in step 104) the 3D position of the at least one pixel to the first processing device, i.e. client device. The client device uses this information (the 3D position) in step 105 together with the first image to create a second model representing at least part of the real object. The second model could be used for camera tracking. In step 106, a second image of at least part of the real object is captured by the camera. A camera pose of the second image (i.e. when capturing the second image) relative to the real object could be determined according to (at least part of) the second model and (at least part of) the second image in step 107.

According to an embodiment, as described above, the first processing device and the second processing device are components of a client-server architecture. For example, the first processing device is or is comprised in a client device and the second processing device is or is comprised in a server computer. For instance, the server computer is located separately and remotely from the client device. According to an embodiment, a client-server architecture comprises one or more client devices which can be coupled to a server computer via a computer network, such as the Internet or any other network connecting multiple computers. The client device may also be a mobile device having a processing device, e.g. a smart phone or tablet computer.

A server computer typically is a computer system (software and suitable computer hardware) that responds to requests across a computer network to provide, or help to provide, a particular service. Server computers, which are often referred to as "server", can be a dedicated computer, but multiple networked computers are also capable of forming a server or server computer in the context of the present invention. In many cases, a server computer can provide several services and can have several server applications running. Server computers operate within a client-server architecture, with server computers including computer programs running to serve the requests of other programs, such as programs running on client devices. Thus, the server computer performs some task on behalf of a client device. Servers often provide services across a network, either to users inside a large organization or to public users via the internet. Typical servers are database server, print server, or some other kind of server. A server software can be run on any capable processing device. It is the machine's role that places it in the category of a server. In the present case, the server computer performs some dedicated tasks on behalf of client device(s) or provides services to client device(s) in regards of determining a model of a real object. The server computer may also be formed by a mobile device, such as a mobile phone or mobile computer.

A client device may be or may comprise any processing device, such as a personal computer, tablet computer, mobile phone or other mobile device, that accesses a service made available by a server computer. For example, a client device accesses a service by way of a computer network.

Figure 1:
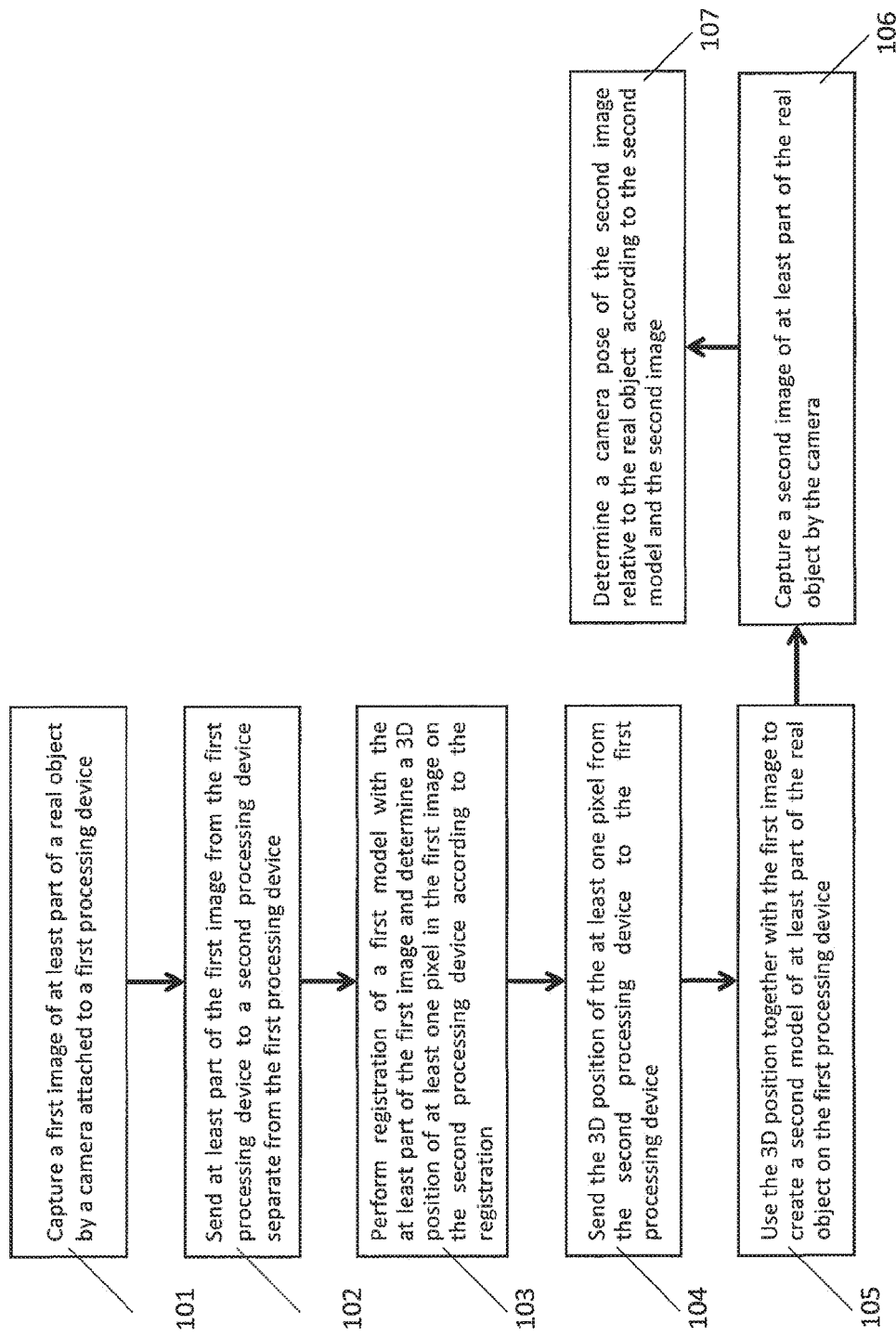
FIG. 1 shows a flowchart of a method according to an embodiment of the invention.
Figure 2:
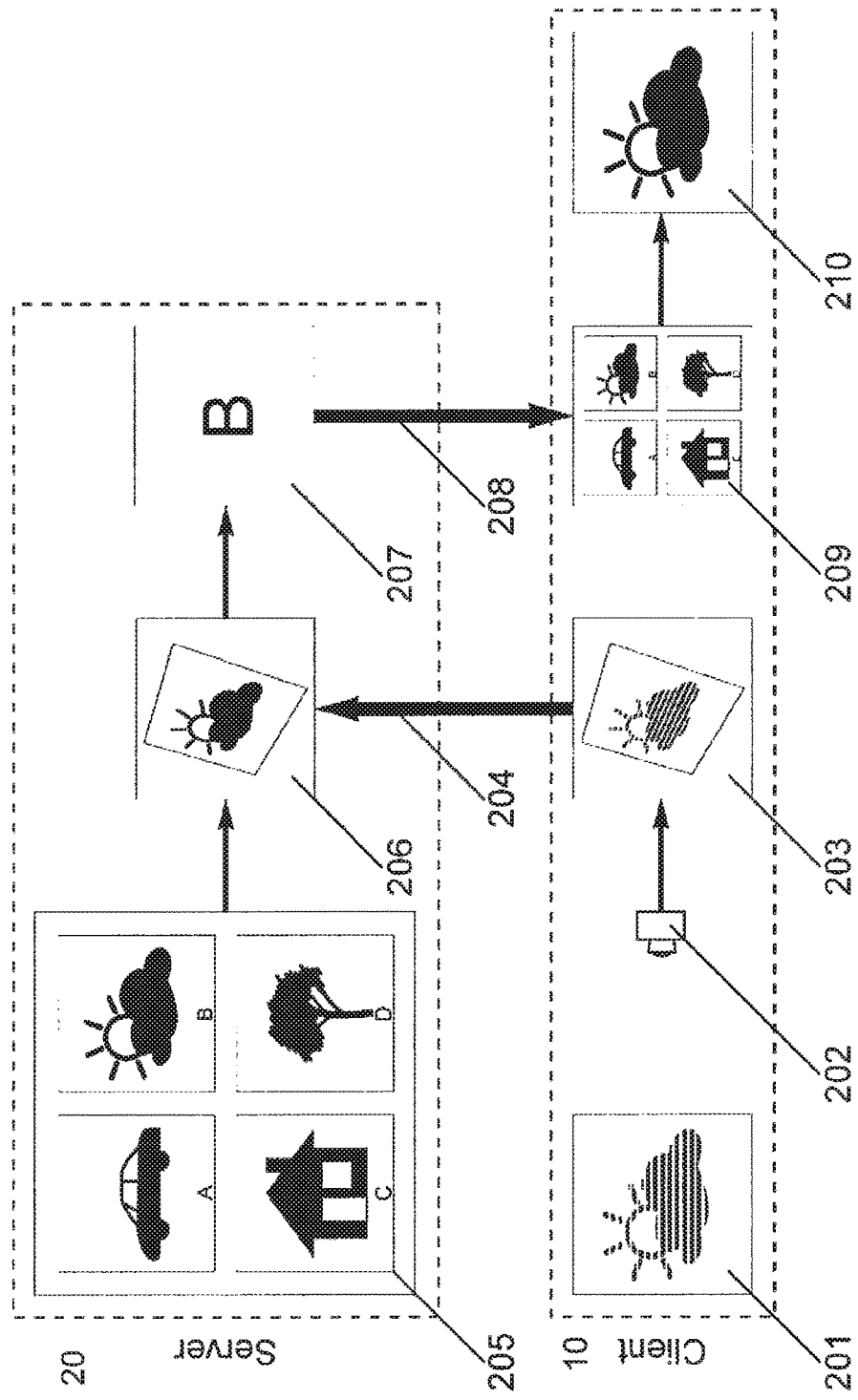
FIG. 2 shows a visualization of a process of determining a model of a real object according to the prior art.

FIG. 2 shows a visualization of a process of determining a model of a real object according to the prior art where a real object 201 is imaged with a camera 202 resulting in an image 203 of the real object which is then sent (step 204) from a client device 10 to a server 20. The server 20 has a database of reference models 205 and compares them with the retrieved image in an object recognition step 206. The identifier (here: B) of the best fitting model 207 is sent back (step 208) to the client device which also has a database 209 of reference models representing at least partially the same real objects as the server database 205, but potentially in a different representation form. The client device then picks the reference model with the provided identifier from the database 209 which results in the final model 210 of the real object present in the camera image.

Figure 3:
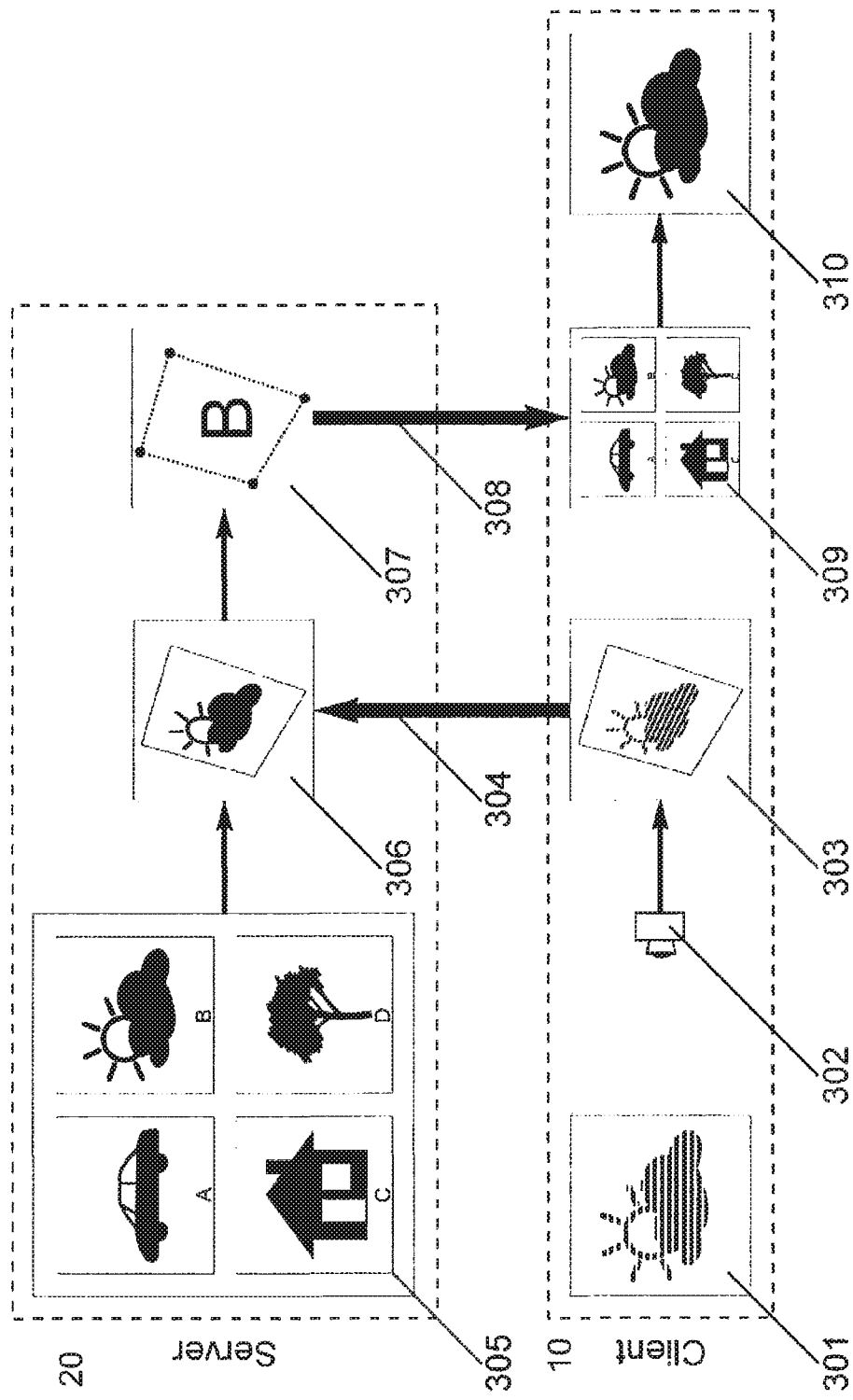
FIG. 3 shows a visualization of another process of determining a model of a real object according to the prior art.

FIG. 3 shows equal steps and components 301-310 as steps and components 201-210 in FIG. 2, except that in addition to the identifier B also the camera pose or the position of the real object in the query camera image is returned from the server 20 to the client device 10 in step 308. This information can be used to aid the initialization process of visual camera pose estimation and tracking on the device, as described in reference [5]. But this information is not used to update a reference model based on the query image 303. The resulting reference model or tracking model 310 in this case is that of from the server database 305.

Figure 4:
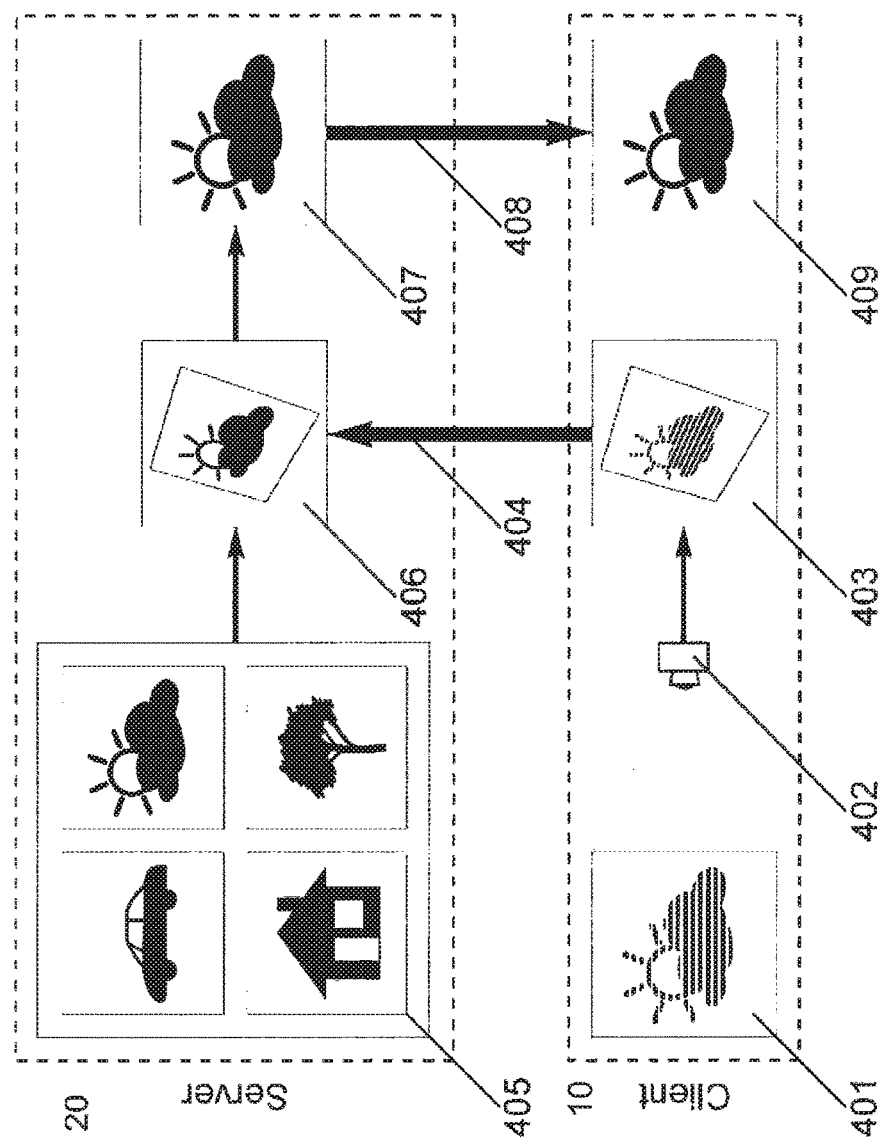
FIG. 4 shows a visualization of another process of determining a model of a real object according to the prior art.

FIG. 4 shows another process according to the prior art in which the client device 10 does not have a local database of reference models, but obtains the needed reference model from the server 20. This is a more realistic approach for very large databases and, for example, used in reference [7]. A real object 401 is captured with a camera 402 resulting in an image 403 of the real object which is then sent (step 404) from the client device 10 to a server 20. The server 20 then matches the reference models in the database 405 against the retrieved query image and determines which reference model fits best (step 406). This reference model 407 is then sent back (step 408) to the client device 10 which subsequently uses the received model 409 as reference model or tracking model.

In the following, with reference to FIGS. 5 to 9, exemplary embodiments of the present invention are described. These examples are meant to provide a better understanding of the invention and do not narrow the present invention to these examples.

For example, a user uses a mobile phone equipped with a camera to capture a query image of a real object or a part of the real object and send the query image to a server via a computer network. The mobile phone of the user is a client device.

In the first example, the real object is a planar rectangular object, e.g. the front of a DVD case. After the server received the query image, the server could perform visual recognition by determining a homography transforming the query image sent by the client device to one of reference models (e.g., images) stored in the server in a way such that the similarity between the reference image and the transformed query image is high. The server can for example perform this determination for every single reference model (i.e., reference image) in the database and finally use the reference image for which the similarity is the highest. Another option is to extract local image features from the query image and to describe them with local image feature descriptors based on the intensities of pixels close to the features and then compare these feature descriptors of the query image with feature descriptors of the reference images in the database. Thereby a feature from the query image and a feature from the database are considered to correspond to the same physical point if the similarity of their descriptors is high. Given a sufficient number of such correspondences, again a homography transformation can be computed registering the query image with a matching reference image. After successfully identifying such a transformation, the information returned from the server to the client device could for example be the (2D) position of the four corners of the DVD case in the query image and optionally the physical width and height of the case and an identifier of the DVD case present in the query image. Instead of the 2D position of the four corners, the method could also return the determined homography, which is a 3×3 matrix. In another embodiment, the server may return only 3D positions of the four corners in a coordinate system of the DVD case and their corresponding 2D positions in the image.

The client device could then use the knowledge on the (2D) position of the four corners in combination with the query image to extract the front of the DVD case from the query image and rectify it using image warping. A rectified image could also be computed from correspondences between the 3D points of the corners and their 2D points in the image. Finally, the rectified image patch can be used as a tracking image (i.e. tracking model) for template localization and tracking by using the camera of the client device. The optionally obtained physical scale of the object can be used to scale virtual overlays correctly and the optionally obtained identifier is used to determine which information to display.

Figure 5:
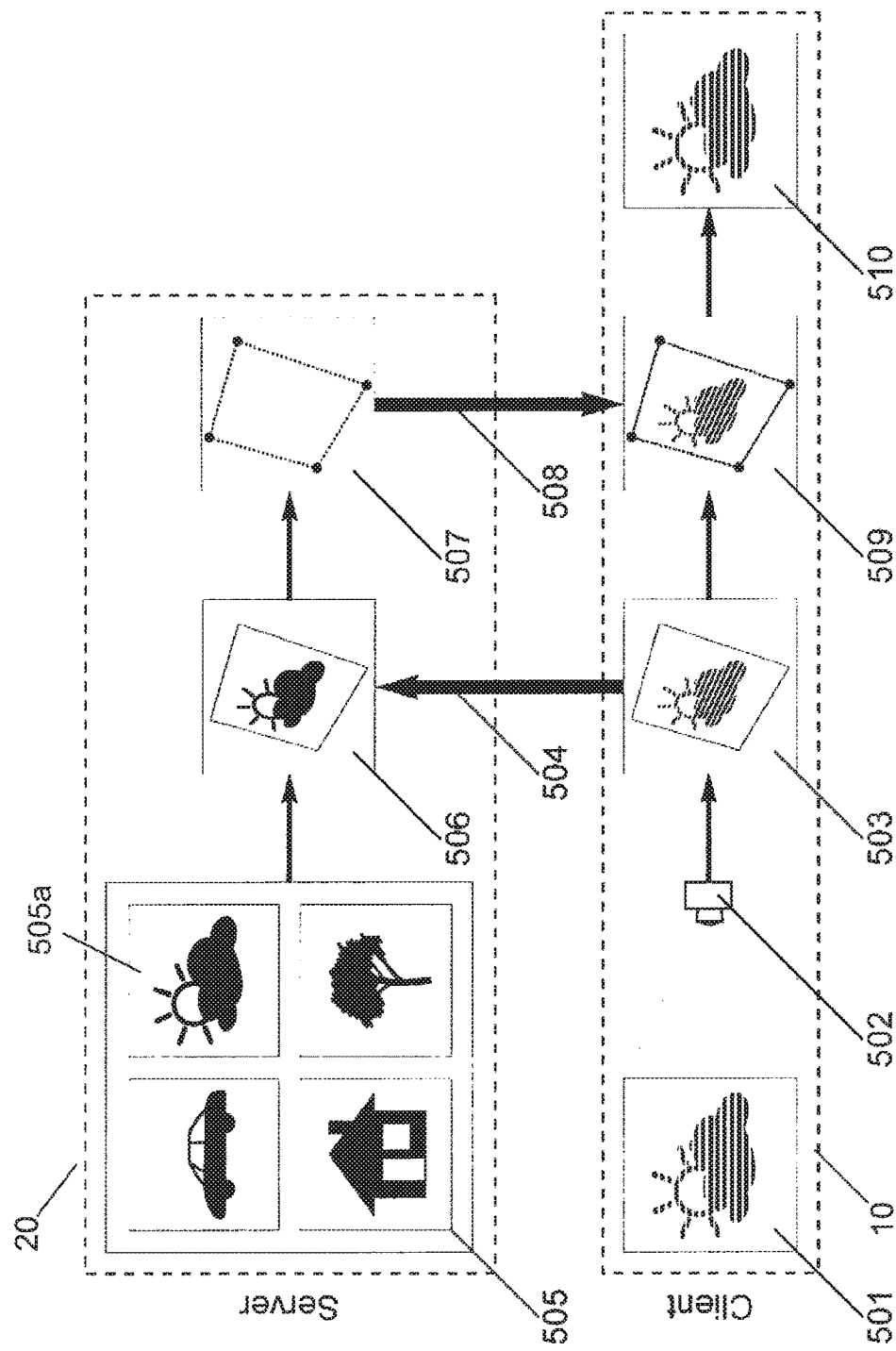
FIGS. 5-9 show visualizations of respective methods of determining a model of a real object according to various embodiments of the invention.

FIG. 5 depicts an exemplary embodiment of the present invention where the captured real object is planar and a model for such an object is a bitmap image. On the client side, a planar real object 501 is captured by a camera 502 associated with the client device 10 resulting in an image 503 of the real object. This image is then sent from the client device 10 to a server 20 (step 504) by means of, e.g., a wireless communication interface. The server 20 compares the image to models in its database 505 and determines the best fitting model 505a as a first model in a registration step 506. The spatial transformation between the first model 505a and the camera image 503 is then found (step 507) and sent back to the client device 10 (step 508). Thereafter, the client device 10 uses the spatial transformation in combination with the camera image 503 in a processing step 509 to obtain a new model 510 as a second model of the planar real object 501 present in the camera image 503. Note that the resulting second model 510 on the client side differs from the first model 505a in the server's database 505. FIG. 5 shows the image of the resulting second model 510 on the client side striped, which symbolically can represent any image degradation such as noise, blur, changes in brightness and contrast, etc., or changes of the visual appearance of the real object 501 as a result of changes in illumination, weather, or environmental influences. The second model 510 could be used on the client side for determining an image position of at least part of the real object 501 in a second camera image and/or for tracking the camera 502 of the client device 10 in a second camera image with respect to the captured real object 501 according to at least part of the second image and at least part of the second model 510.

In another example, the real object is a general 3D object, e.g. a building. The server may receive a query image from the client device and then try to register it with at least one reference model in the database. In this case, the reference model of a real object can, for example, be a dense and textured 3D polygon model. Any registration method based on correspondences between 2D points and/or lines in the query image and 3D points and/or lines on the reference model can then be used to determine which reference model fits best the query image and what the transformation is to register the model with the image. Once this transformation is determined, the 3D position of the surface corresponding to each pixel in the query image which is part of the registered model can be determined. The server then could, for example, return a position map to the client device which encodes for at least one pixel in the query image the 3D point in the model coordinate system it corresponds to. The position map could also be a set of poses, each of which describes a camera pose when the query image is captured relative to a part of the real object. Given this position map and the query image, the client could then perform feature detection and description on the query image and assign every extracted feature the 3D position looked up in the position map.

Note that different interpolation techniques can be applied in case the position map does not contain a 3D position for a given pixel. If an extracted feature is located on a pixel for which the obtained position map does not contain any information, nearest neighbor interpolation could determine the closest pixel to the feature for which the position map contains geometric 3D information, i.e. a 3D position, and use this position for the feature. Another option would be to identify for a feature the three closest pixels for which the position map contains geometric information and use barycentric coordinates to compute an interpolated 3D position for the feature as a weighted average of the 3D positions of the three closest pixels with geometric information in the position map. Finally, the set of feature descriptors with associated 3D positions can be used as reference model for localization and tracking.

The server may also return a set of polygons that determine or approximate the shape of a 3D real object or a part of a 3D real object. The polygons could be represented by a set of corner points in the coordinate system of the 3D real object. To determine the 3D position in the model coordinate system for an extracted feature from the query image, the client device could then project the polygons into the query image using a transformation also obtained from the server and determine the 3D position on the polygon surface projecting onto the position of the feature. This 3D position would then be used as 3D feature position.

Figure 6:
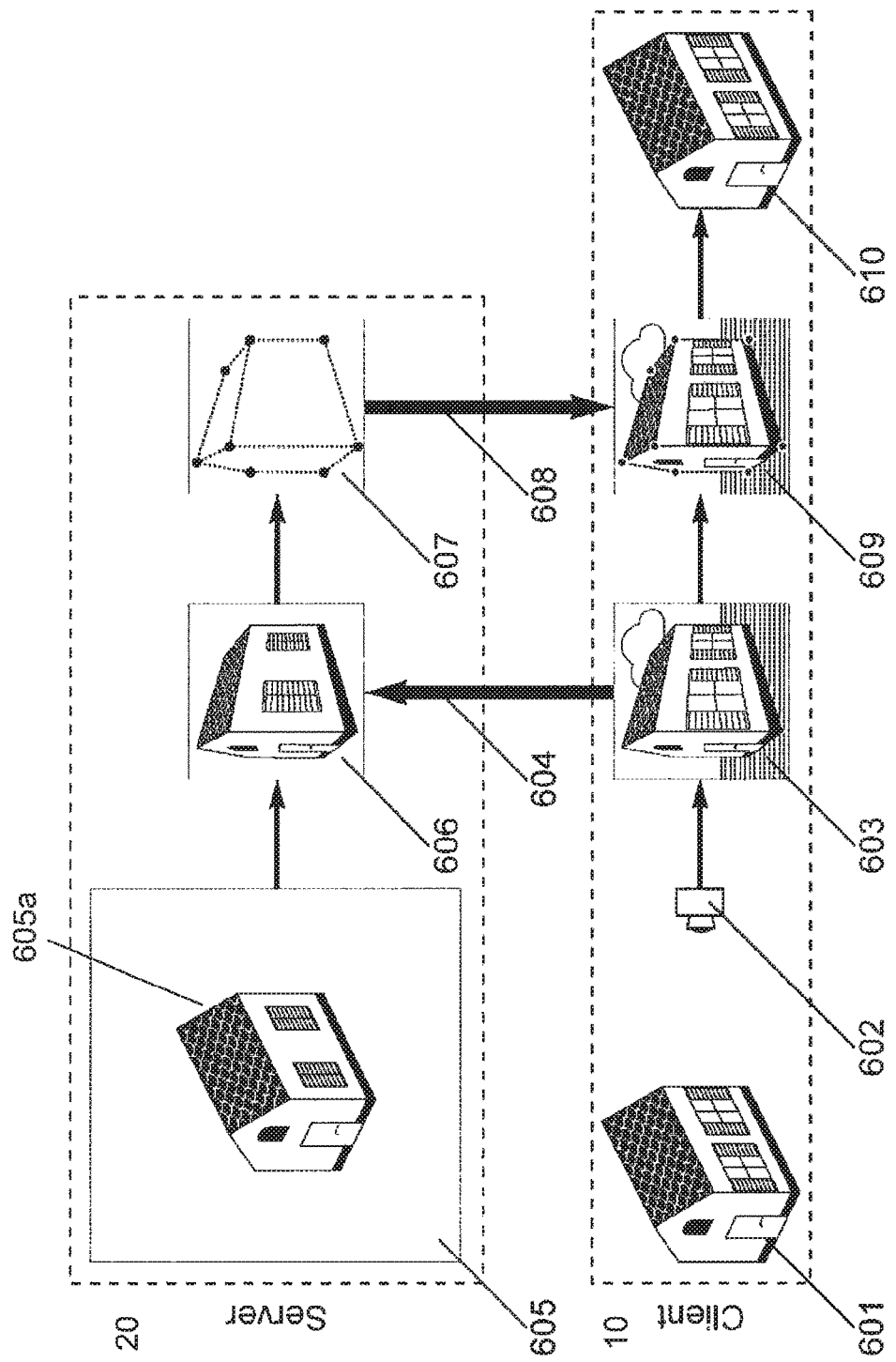

FIG. 6 illustrates another embodiment of the present invention in which the real object is a three-dimensional building 601. An image 603 of this building is taken with a camera 602 coupled to or part of the client device 10 which is then sent to the server 20 (step 604). The server's database 605 in this case only comprises a single model 605a, which is then being registered as a first model with the camera image 603 in a registration step 606 on the server 20. Note that also in this case the server 20 may contain multiple reference models of different buildings or landmarks. Based on the determined registration, the 3D position in the coordinate system of the database model (first model) 605a corresponding to 2D points (pixels) in the camera image 603 are determined (step 607) and sent back to the client device 10 (step 608). Given this information and the camera image 603, the combination of both in a processing step 609 leads to a new model 610 of the real object present in the camera image as a second model which is consistent with the camera image 603.

In this example the blinds of the building are open in the current situation of building 601 and therefore in the camera image 603, while they are closed in the model 605a of database 605 on the server 20. The registration method (step 606) on the server is robust enough to handle such inconsistencies. This does, however, not necessarily apply to a localization and tracking method that can run on the client device in real-time afterwards. Therefore, the present invention obtains a second model 610 on the client side that is consistent with the current state and visual appearance of the real object 601, i.e. has the blinds opened in the present example. This second model 610 can then be used subsequently for, e.g., image processing and/or visual camera pose tracking performed on the client device 10.

Figure 7:
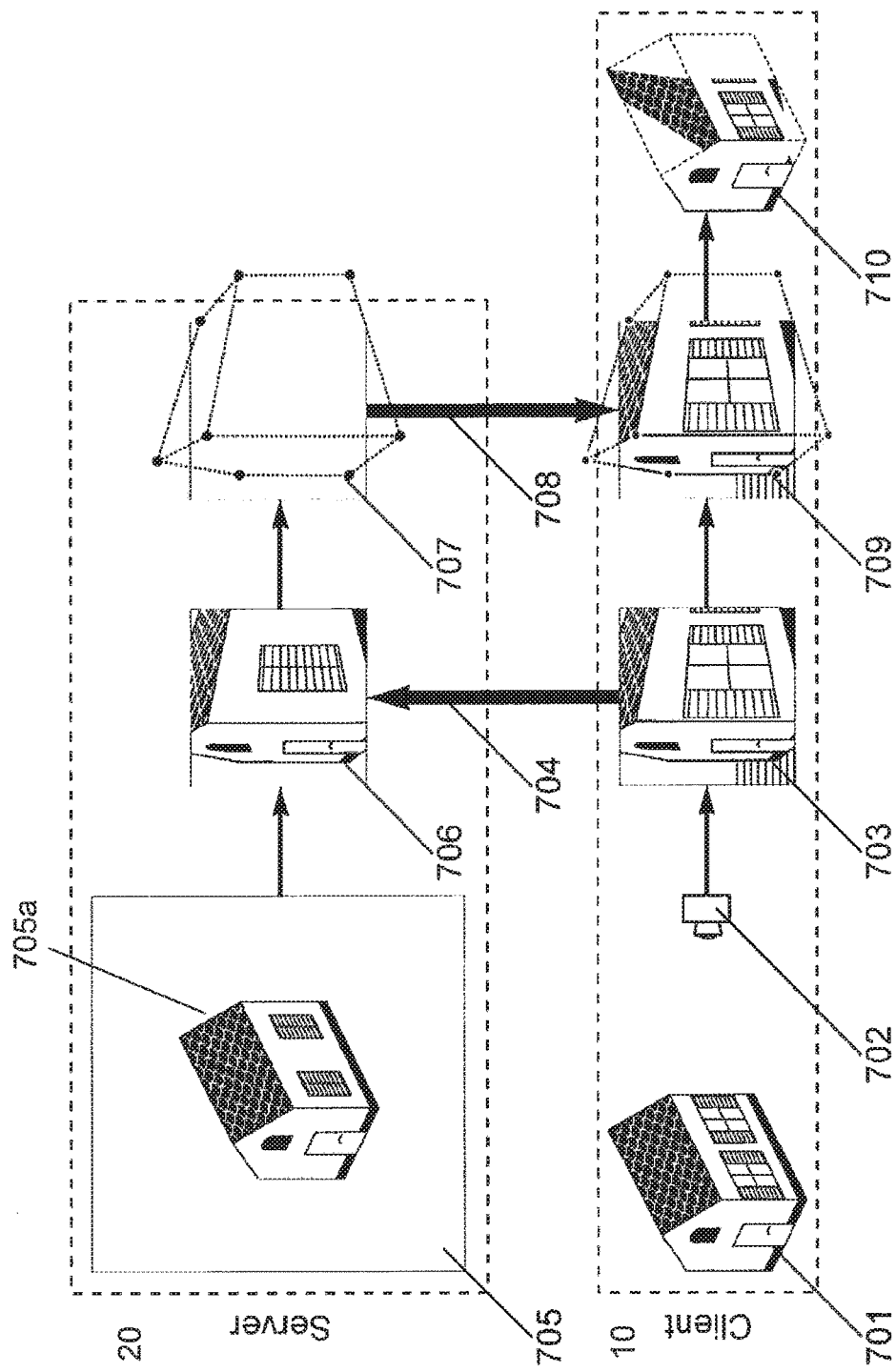

FIG. 7 shows the same scenario as FIG. 6 from a different camera position where only a part of the real object 701 is visible in the image 703 captured with a camera 702. The process of image transmission 704, registration 706 with one of the models of the database 705 (here, first model 705a), determination of the spatial transformation 707 and sending this information back from the server 20 to the client device 10 (step 708) is the same as that explained for FIG. 6. In the processing step 709, however, the spatial information exceeds the image boundaries, which results in an up-to-date model 710 (second model) for which the visual appearance is defined only partially. Still such a partial second model 710 can be used, e.g., for subsequent visual camera pose estimation and tracking on the client device 10. In this regard, FIG. 9 shows how such a partial second model can be completed during tracking on the client side, as explained in more detail below.

Figure 8:
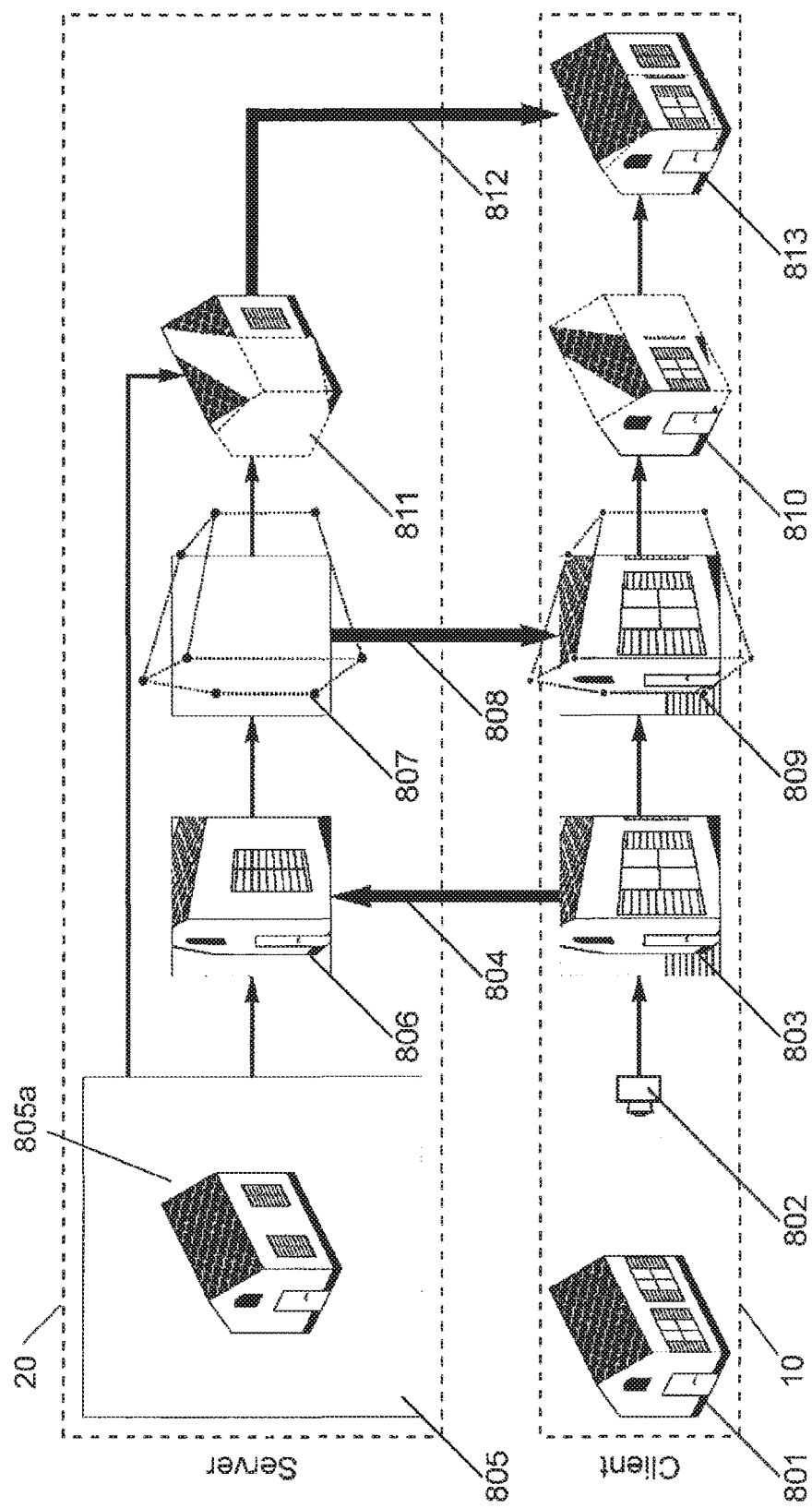

FIG. 8 shows another embodiment of the present invention in a situation as in FIG. 7. The steps and components 801 to 810 are equal to steps and components 701 to 710. However, in this embodiment the partial second model 810 is completed with information from the first model 805a provided in the server database 805, i.e. of the first model 805a used in the registration step 806. In a server-side processing step 811, those parts of the first model 805a that are not visible in the camera image 803 are determined based on the found transformation (step 807) and composed to a partial model 811. This partial model 811 is then sent to the client device 10 (step 812), and the client device 10 updates visual information of the second model 810, which is only a partial model, for at least part of the second model with visual information obtained from the determined partial model 811, i.e. with information obtained from the first model 805a. In this embodiment, updating the second model 810 results in a full model 813. Note that this model 813 is partially up-to-date, i.e. contains visual information from the current camera image 803 while other parts, that are not visible in the camera image 803, contain visual information from the server's reference model 805a. In this example, the blinds of the window which are visible in the camera image 803 are opened in the resulting full model 813 while they are closed for the other window (where the visual information comes from the server's reference model 805a).

Figure 9:
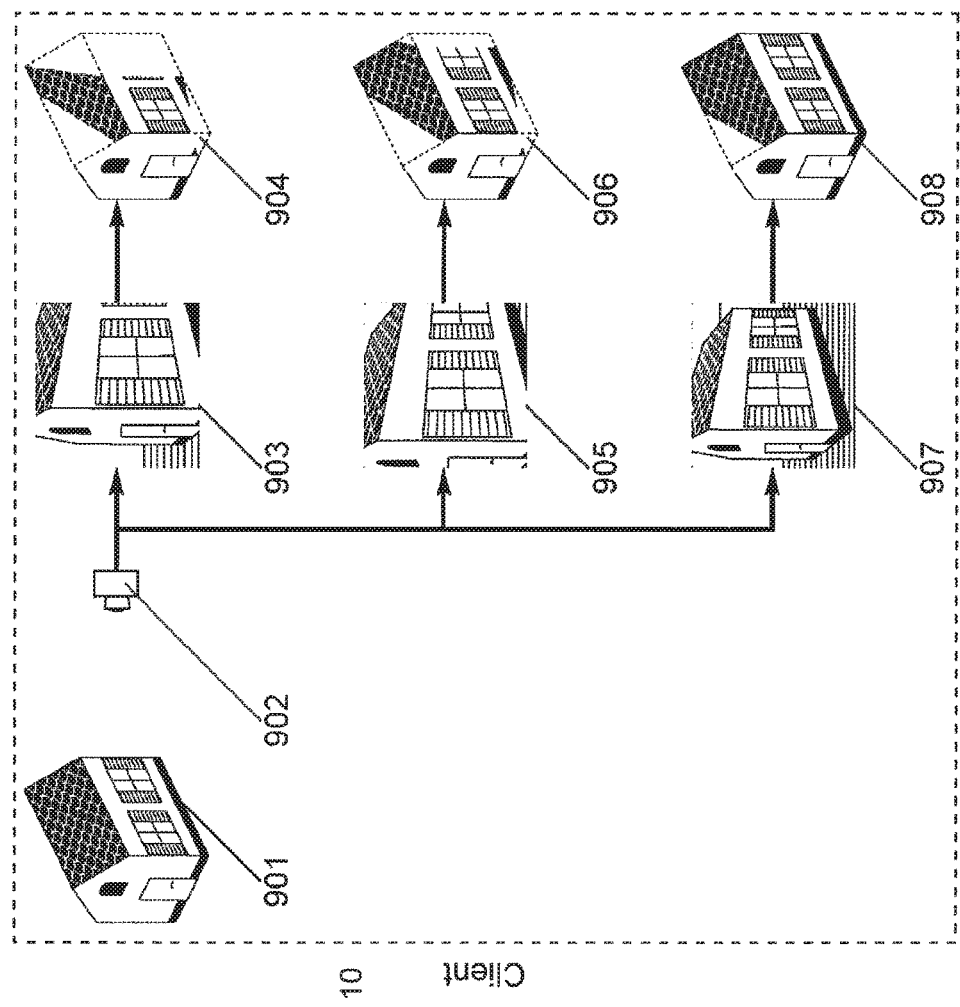

FIG. 9 shows a process which can optionally be performed after obtaining a second model of a real object visible in a camera image as described above. If the resulting model only partially contains up-to-date visual information as is the case in FIGS. 7 and 8, then the model can be completed, e.g., during visual camera pose tracking on the client device 10.

The real object 901 is captured with a camera 902 resulting in a camera image 903. The visual camera pose estimation and tracking method on the client device 10 then determines a registration between the camera image 903 and the partial model 904 (as obtained as, e.g., second model 810 in FIG. 8) which can be used to compute the camera pose with respect to the model 904. After the camera 902 and/or the real object 901 have moved, a new (second) camera image 905 of at least part of the real object 901 is captured at the client side. The algorithm then again determines the registration of this camera image 905 with the latest reference model 904. Once this registration has been performed, those parts of the reference model 904 which do not contain up-to-date visual information and are visible in the current camera image 905 are added (or updated) based on the current camera image 905 resulting in a new and more complete reference model 906. This process can be performed iteratively every time a new camera image 907 is available. After being registered with the latest reference model 906 it is checked if the new camera image 907 contains any parts of the real object 901 which are not described in an up-to-date way in the reference model 906. If so, corresponding parts of the reference model 906 are updated based on the visual information from the camera image 907 resulting in a new reference model 908. In this way, the client device 10 updates visual information of the determined reference model (second model) for at least part of the reference model with visual information obtained from another camera image of at least part of the real object 901.

Note that similarly those parts of the resulting model 813 in FIG. 8 can be updated, that contain visual information from the server's first model 805a, which may be outdated visual information.

To reduce the amount of information to be transmitted from the server to the client, feature detection in the query image may be performed on the server side, wherein only the 3D position corresponding to the detected 2D features is transmitted instead of for every pixel in the camera image. The client device then performs feature description for the already extracted features with known 3D positions which results in the same reference model representation as described previously.

Even more memory efficient is a different representation of the same information as described in the following. Instead of transmitting the (3D) absolute position of a set of features (or pixels) in the query image, it may be determined to return the (1D) distance to the camera, i.e. depth, of these features (or pixels) and additionally the camera pose and intrinsic camera parameters, such as focal length etc. Given the depth of a feature (or pixel) and the extrinsic and intrinsic camera parameters, the corresponding 3D position of that feature (or pixel) can be easily computed. The corresponding 3D position can be computed in the camera coordinate system. Having a known pose of the camera relative to the real object described by the extrinsic camera parameters, the corresponding 3D position can also be expressed in the coordinate system of the real object.

This exemplary implementation then proceeds as in the previous two examples to create a model of the real object present in the camera image on the client side.

Note that in addition to the recognition result, the server might also transmit information to be displayed, e.g. text, images, or 3D models, to the client device. This part is not affected by the present invention.

Since many client devices, e.g. mobile phones or tablet computers, are equipped nowadays with sensors such as accelerometers, gyroscopes, compasses, and GPS receivers, an embodiment of the invention additionally transmits readings of one or more of these sensors, preferably at a time close to the exposure time of the query image to the server. These sensor readings can then be used by the server to aid visual recognition and registration of the camera image with reference models in various ways.

Throughout this document it is described that (at least part of) an image is sent from the first processing device (e.g., client device) to a second processing device (e.g., server). It is known to the skilled person that this includes sending any processed version of the camera image which allows for registration with a reference model instead of sending any raw original image data. Processing thereby includes any one of compression (e.g. JPEG, PNG, ZIP), encryption (e.g. RSA encryption, Schnorr signature, El-Gamal encryption, PGP), conversion to another color space or grayscale, cropping or scaling the image or conversion into a sparse representation based on feature descriptors, and their combinations. All these image processing methods can optionally be performed and are covered by the terminology of sending at least part of the first image, as used in the claims.

What is claimed is:

1. A computer-readable medium comprising computer-readable code which, when executed by a processor, causes the processor to:
obtain, by a first processing device, a first image of at least part of a real object captured by a camera,
send, by the first processing device, at least part of the first image to a second processing device that is physically separate from the first processing device, wherein a first model of the real object is stored on the second processing device, and wherein the first model comprises 3D geometric information associated with the real object;
receive, by the first processing device, the 3D geometric information and a registration between the first image and the first model of the real object from the second processing device,
wherein the registration indicates a spatial relationship between the first image and the real object; and
generate, by the first processing device, a second model of at least part of the real object based on the 3D geometric information received from the second processing device, the registration, and material information obtained from the first image at the first processing device.

2. The computer-readable medium of claim 1, wherein the 3D geometric information is in one of a coordinate system of the first model and a coordinate system of the camera.

3. The computer-readable medium of claim 1, wherein the computer-readable code further comprises computer-readable code to cause the processor to:
obtain, by the first processing device, a second image of at least part of the real object captured by the camera; and
determine, by the first processing device, a pose of the camera while capturing the second image relative to the real object according to at least part of the second image and at least part of the second model.

4. The computer-readable medium of claim 1, wherein the computer-readable code further comprises computer readable code to cause the processor to:
obtain, by the first processing device, a second image of at least part of the real object captured by the camera; and determine, by the first processing device, an image position of at least part of the real object in the second image according to at least part of the second image and at least part of the second model.

5. The computer-readable medium of claim 4, wherein the computer readable code further comprises computer-readable code to cause the processor to:
use the image position in an Augmented Reality application to overlay a virtual object with the second image.

6. The computer-readable medium of claim 1, wherein the real object is a planar object and wherein the 3D geometric information comprises 3D positions of a plurality of pixels in the first image.

7. The computer-readable medium of claim 1, wherein the real object is a three-dimensional object and wherein the 3D geometric information comprises 3D positions in a coordinate system of the first model corresponding to 2D pixels in the first image.

8. The computer-readable medium of claim 1, wherein the computer-readable code further comprises computer-readable code to cause the processor to:
send at least one reading from at least one sensor associated with the first processing device to the second processing device, wherein the at least one sensor comprises at least one of a GPS sensor, a magnetometer, an accelerometer, and a gyroscope.

9. The computer-readable medium of claim 1, wherein sending at least part of the first image includes sending a processed version of the at least part of the first image to the second processing device, wherein the processed version of the at least part of the first image includes data derived from at least one of compression, encryption, cropping, scaling, blurring, sharpening, color conversion, and conversion into a sparse representation based on feature descriptors of any representation that allows for registration.

10. The computer-readable medium of claim 1, wherein sending at least part of the first image to the second processing device uses at least one of the following techniques: Bluetooth radio, infrared light, ZigBee, Wi-Fi, orthogonal frequency-division multiplexing (OFDM), WiMAX, cellular network, mobile network, Global System for Mobile Communications, Personal Communications Service, and Digital Advanced Mobile Phone Service.

11. The computer-readable medium of claim 1, wherein the computer-readable code further comprises computer-readable code to cause the processor to:
use, by the first processing device, at least part of the second model in vision-based localization for visual camera localization and tracking relative to the real object.

12. The computer-readable medium of claim 1, wherein the 3D geometric information comprises a distance between at least part of the real object and the camera.

13. The computer-readable medium of claim 1, wherein the first processing device and the second processing device are components of a client-server architecture, wherein the first processing device is, or is comprised in, a client device and the second processing device is, or is comprised, in a server.

14. The computer-readable medium of claim 1, wherein the first processing device is comprised in a mobile device, particularly a mobile phone, a tablet computer, a handheld device, a head-worn device, a smart watch, or a wearable computer with a video-see-through display or an optical-see-through head-mounted display.

15. A system for determining a model which describes at least part of a real object, comprising:
a first processing device; and
a memory, coupled to the first processing device and comprising computer code that, when executed by the first processing device, causes the first processing device to:
obtain a first image of at least part of the real object captured by a camera,
send at least part of the first image to a second processing device that is physically separate from the first processing device, wherein a first model of the real object is stored on the second processing device, and wherein the first model comprises 3D geometric information associated with the real object,
receive, by the first processing device, the 3D geometric information and a registration between the first image and the first model of the real object from the second processing device
wherein the registration indicates a spatial relationship between the first image and the real object; and
determine, by the first processing device, a second model of at least part of the real object comprising the 3D geometric information received from the second processing device, the registration, and material information obtained from the first image at the first processing device.

16. The system of claim 15, wherein the 3D geometric information is in one of a coordinate system of the first model and a coordinate system of the camera.

17. The system of claim 15, wherein the memory further comprises computer code to cause the processor to:
obtain a second image of at least part of the real object captured by the camera; and
determine a pose of the camera while capturing the second image relative to the real object according to at least part of the second image and at least part of the second model.

18. The system of claim 15, wherein the memory further comprises computer code to cause the processor to:
obtain a second image of at least part of the real object captured by the camera; and
determine an image position of at least part of the real object in the second image according to at least part of the second image and at least part of the second model.

19. The system of claim 18, wherein the memory further comprises computer code to:
use the image position in an Augmented Reality application to overlay a virtual object with the second image.

20. A method for determining a model that describes at least part of a real object, comprising:
obtaining, by a first processing device, a first image of at least part of the real object captured by a camera,
sending, by the first processing device, at least part of the first image to a second processing device that is physically separate from the first processing device, wherein a first model of the real object is stored on the second processing device, and wherein the first model comprises 3D geometric information associated with the real object,
receiving, by the first processing device, the 3D geometric information and a registration between the first image and the first model of the real object from the second processing device
wherein the registration indicates a spatial relationship between the first image and the real object; and
obtaining, by the first processing device, a second model of at least part of the real object based on the 3D geometric information received from the second processing device, the registration, and material information obtained from the first image at the first processing device.

\* \* \* \* \*